United States Patent
He et al.

(10) Patent No.: US 9,728,534 B2
(45) Date of Patent: Aug. 8, 2017

(54) DENSELY SPACED FINS FOR SEMICONDUCTOR FIN FIELD EFFECT TRANSISTORS

(71) Applicant: International Business Machines Corporation, Armonk, NY (US)

(72) Inventors: Hong He, Schenectady, NY (US); Chiahsun Tseng, Wynantskill, NY (US); Chun-Chen Yeh, Clifton Park, NY (US); Yunpeng Yin, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/877,186

(22) Filed: Oct. 7, 2015

(65) Prior Publication Data
US 2016/0027776 A1   Jan. 28, 2016

Related U.S. Application Data

(62) Division of application No. 14/198,005, filed on Mar. 5, 2014.

(51) Int. Cl.
| | |
|---|---|
| H01L 27/088 | (2006.01) |
| H01L 21/308 | (2006.01) |
| H01L 29/66 | (2006.01) |
| H01L 21/8234 | (2006.01) |
| H01L 21/84 | (2006.01) |
| H01L 27/12 | (2006.01) |
| H01L 29/16 | (2006.01) |
| H01L 29/78 | (2006.01) |

(52) U.S. Cl.
CPC ...... *H01L 27/0886* (2013.01); *H01L 21/3085* (2013.01); *H01L 21/3088* (2013.01); *H01L 21/823431* (2013.01); *H01L 21/845* (2013.01); *H01L 27/1211* (2013.01); *H01L 29/16* (2013.01); *H01L 29/66795* (2013.01); *H01L 29/785* (2013.01)

(58) Field of Classification Search
CPC ............. H01L 27/10826; H01L 29/785; H01L 27/10879; H01L 27/1211; H01L 21/823487; H01L 21/823885; H01L 27/10876
See application file for complete search history.

(56) References Cited

U.S. PATENT DOCUMENTS

| | | |
|---|---|---|
| 6,875,703 B1 | 4/2005 | Furukawa et al. |
| 7,101,763 B1 | 9/2006 | Anderson et al. |

(Continued)

OTHER PUBLICATIONS

Bu, "FINFET Technology a Substrate Perspective", 2011 IEEE International. SOI Conference (SOI), 2011, slide presentation, 27 pages.

(Continued)

*Primary Examiner* — Mohammad Choudhry
(74) *Attorney, Agent, or Firm* — Cantor Colburn LLP; Vazken Alexanian

(57) ABSTRACT

A method of forming a fin-based field-effect transistor device includes forming one or more first fins comprising silicon on a substrate, forming epitaxial layers on sides of the one or more first fins, and removing the one or more first fins to form a plurality of second fins.

6 Claims, 15 Drawing Sheets

(56) References Cited

U.S. PATENT DOCUMENTS

| | | |
|---|---|---|
| 7,732,343 B2 | 6/2010 | Niroomand et al. |
| 8,026,044 B2 | 9/2011 | Lee et al. |
| 8,026,179 B2 | 9/2011 | Lue |
| 2005/0048727 A1* | 3/2005 | Maszara ............... A61F 5/3776 438/285 |
| 2005/0173759 A1* | 8/2005 | Kim .................. H01L 29/66621 257/331 |
| 2005/0277755 A1 | 12/2005 | Hamada et al. |
| 2010/0167548 A1 | 7/2010 | Kim |
| 2010/0183961 A1* | 7/2010 | Shieh ..................... G03F 1/144 430/30 |
| 2012/0128935 A1 | 5/2012 | Dunn et al. |
| 2013/0256759 A1* | 10/2013 | Vellianitis ............. H01L 29/785 257/200 |

OTHER PUBLICATIONS

Hinsberg et al., "Self-assembling materials for lithographic patterning: overview, status, and moving forward", Proc. SPIE, vol. 7637, 2010, 76370G, 11 pages.

Hwang et al., "A middle-1X nm NAND flash memory cell (M1X-NAND) with highly manufacturable integration technologies", 2011 IEEE International Electron Devices Meeting (IEDM), Dec. 5-7, 2011, pp. 9.1.1-9.1.4.

* cited by examiner

DENSELY SPACED FINS FOR SEMICONDUCTOR FIN FIELD EFFECT TRANSISTORS

DOMESTIC PRIORITY

This application is a divisional of U.S. patent application Ser. No. 14/198,005, filed Mar. 5, 2014, the disclosure of which is incorporated by reference herein in its entirety.

BACKGROUND

The present invention relates to fin field-effect transistors (finFETs), and more specifically, to densely spaced fins for semiconductor finFETs.

Field-effect transistors (FETs) generate an electric field, by a gate structure, to control the conductivity of a channel between source and drain structures in a semiconductor substrate. The source and drain structures may be formed by doping the semiconductor substrate, a channel region may extend between the source and the drain on the semiconductor substrate and the gate may be formed on the semiconductor substrate between the source and drain regions.

The size of FETs has been reduced through the use of fin-based FETs (finFETs), in which the channels of the FET are fin-shaped. Fins of a finFET use a vertical channel structure to increase the surface area of the channel exposed to the gate. As a result, the gate has a greater influence on the channel, because the gate is formed to cover multiple sides of the channel.

The continued miniaturization of electronics has required finFETs to be made continually smaller. However, the size of the fins and the spaces, or pitch, between fins is limited by the lithographic or other etching techniques used to form the fins. One technique currently used to form fins of finFET semiconductor devices is sidewall image transfer (SIT). In SIT, a sidewall spacer is formed on a sacrificial structure, such as a mandrel, which is defined in the present specification as a narrow band of material. The sacrificial material is removed, and the sidewall spacers are then used to etch fins in a silicon-based substrate. In conventional SIT processes, the width of the mandrels and the spaces between the mandrels define the pitch of the fins of the semiconductor device.

SUMMARY

According to one embodiment of the present invention, a method for forming a fin-based field-effect transistor (finFET) device includes forming one or more first fins comprising silicon on a substrate, forming epitaxial layers on sides of the one or more first fins, and removing the one or more first fins to form a plurality of second fins.

According to another embodiment of the present invention, a semiconductor device includes a silicon substrate, a plurality of epitaxially-grown fins extending from the silicon substrate, and a gate structure covering a portion of one or more of the epitaxially-grown fins to separate the fin into source/drain portions.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Fin-based field-effect transistors (finFET) devices are typically formed using etching processes, such as by photolithography, to form fins, and gates are formed on the fins. However, the distances between the fins are limited according to the etching processes used.

Figure 1:
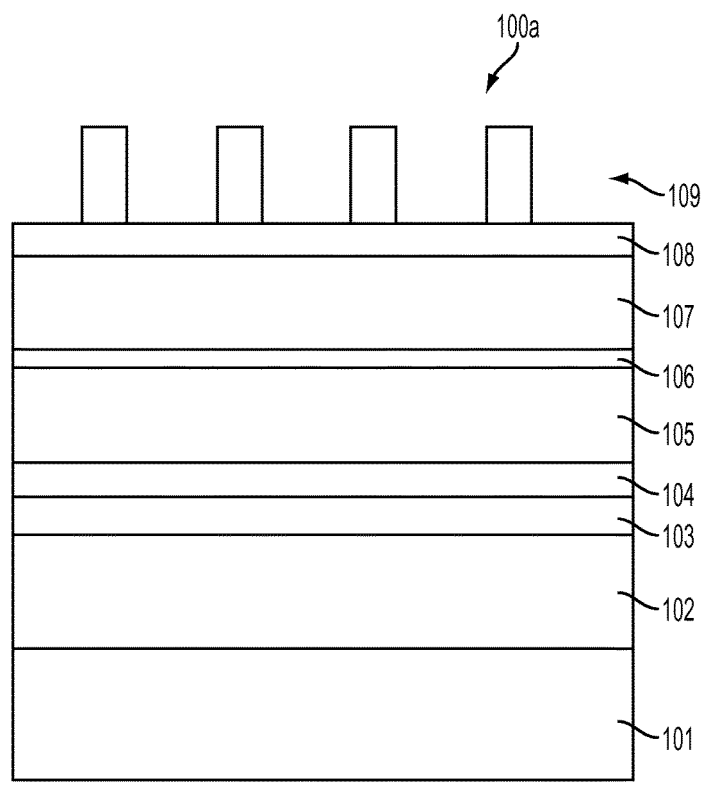
FIG. 1 illustrates an intermediate finFET semiconductor device according to an embodiment of the invention, including a photoresist layer for etching.

FIG. 1 illustrates a cross-section of an intermediate fin field-effect transistor (finFET) device 100a according to an embodiment of the invention. In the present specification and claims, an "intermediate" finFET device is defined as a finFET device in a stage of fabrication prior to a final stage. The finFET device 100a includes a silicon (Si) substrate 101, a mandrel layer 102, such as a silicon germanium (SiGe) layer 102, formed on the Si substrate 101, and a first hard mask layer 103 formed on the SiGe layer 102. In one embodiment, the first hard mask layer 103 is made of silicon nitride (SiN). A second hard mask layer 104 is formed on the first hard mask layer 103. In one embodiment, the second hard mask layer 104 is silicon dioxide ($SiO_2$).

A mandrel layer 105 is formed on the second hard mask layer 104. The mandrel layer 105 may be a silicon-based layer. A third hard mask layer 106 is formed on the mandrel layer 105. The third hard mask layer 106 may be made of SiN. A sacrificial layer 107 is formed on the third hard mask layer 106. The sacrificial layer 107 may be an organic planarization layer (OPL). In one embodiment, and anti-reflective coating 108 is formed on the sacrificial layer 107. The anti-reflective coating 108 may be a silicon anti-reflective coating (SiARC). A patterned photoresist layer 109 is formed on the anti-reflective coating 108. The pattern of the photoresist layer 109 may correspond to narrow bands, or mandrels, such that an etching process using the photoresist layer 109 results in mandrels being formed.

Embodiments of the invention encompass various materials and thicknesses of layers of the intermediate finFET device 100a. For example, in one embodiment, the third hard mask layer 106 has a thickness of around 180 Angstroms (Å), the mandrel layer 105 has a thickness of around 1000 Å, the second hard mask layer 104 has a thickness of around 300 Å, and the first hard mask layer 103 has a thickness of around 400 Å.

Figure 2:
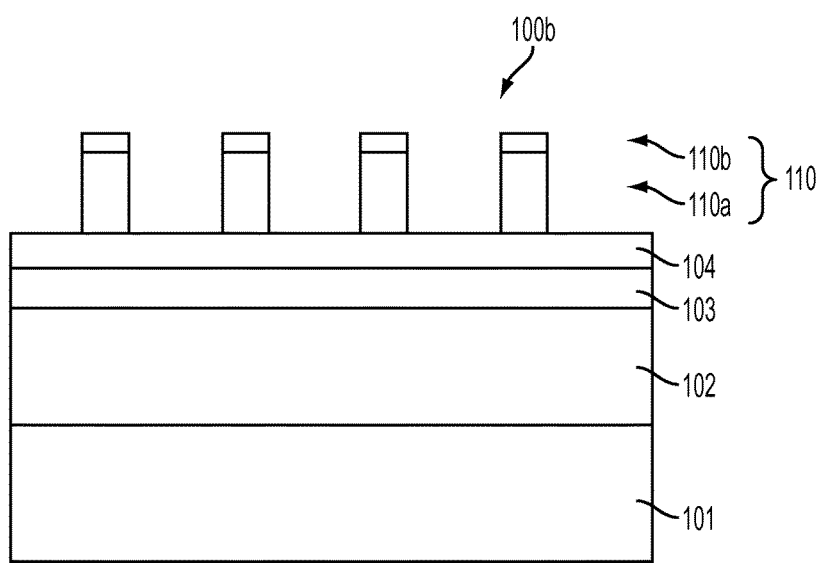
FIG. 2 illustrates the intermediate finFET semiconductor device of FIG. 1 following an etching process to form mandrels.

In FIG. 2, an intermediate fin field-effect transistor (finFET) device 100b is shown having after an etch process by which the pattern of the patterned photoresist layer is transferred through the anti-reflective coating 108 and the sacrificial layer 107 so as to form mandrels 110, each including a base portion 110a formed of the mandrel layer 105 and a cap portion 110b formed of the third hard mask layer 106. In one embodiment, the coating 108 and sacrificial layer 107 are removed through a reactive ion etching (RIE) process, such as in a $N_2H_2$ ambient atmosphere.

Figure 3:
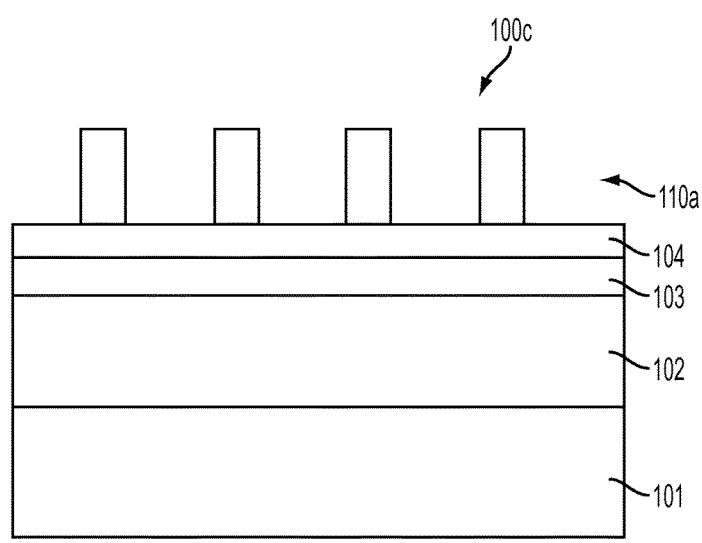
FIG. 3 illustrates the intermediate finFET semiconductor device of FIG. 2 after removal of the a silicon nitride cap.

In FIG. 3, an intermediate fin field-effect transistor (finFET) device 100c is shown on which the cap portions 110b have been removed to leave the base portion 110a of the mandrels intact and free-standing. In one embodiment, the cap portions 110b are removed by a wet etch process, such as using hot phosphorus.

Figure 4:
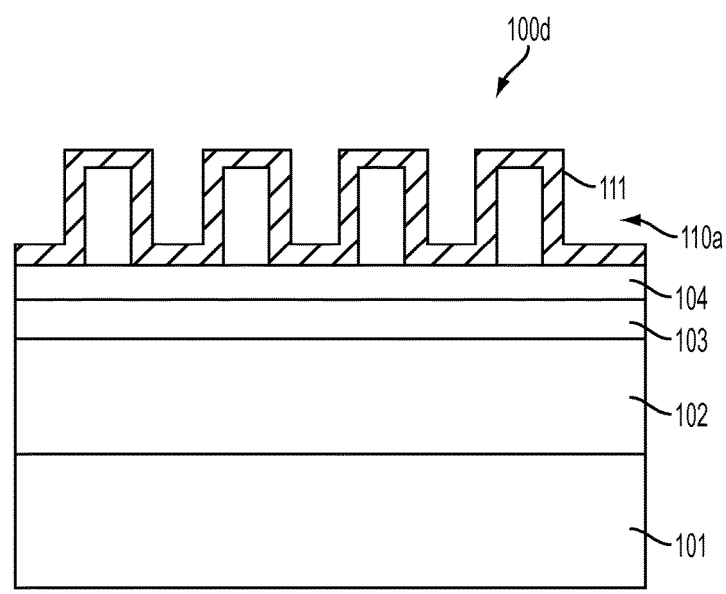
FIG. 4 illustrates the intermediate finFET semiconductor device of FIG. 3 after forming a spacer layer according to an embodiment of the invention.

In FIG. 4, an intermediate fin field-effect transistor (finFET) device 100d is shown having a spacer layer 111 formed on the base portion 110a of the mandrels and the second hard mask layer 104. The spacer layer 111 is formed on the top and sides of the base portion 110a of the mandrels. In one embodiment, the spacer layer 111 is formed of SiN. The spacer layer 111 may be formed by any process, including any deposition process to deposit the SiN on exposed surfaces of the base portion 110a of the mandrels and the second hard mask layer 104. Since the pitch between the mandrels is small (between 40-60 nm), the SiN spacer (spacer layer 111) needs to be deposited with good gap fill and conformity by molecular layer deposition (MLD).

Figure 5:
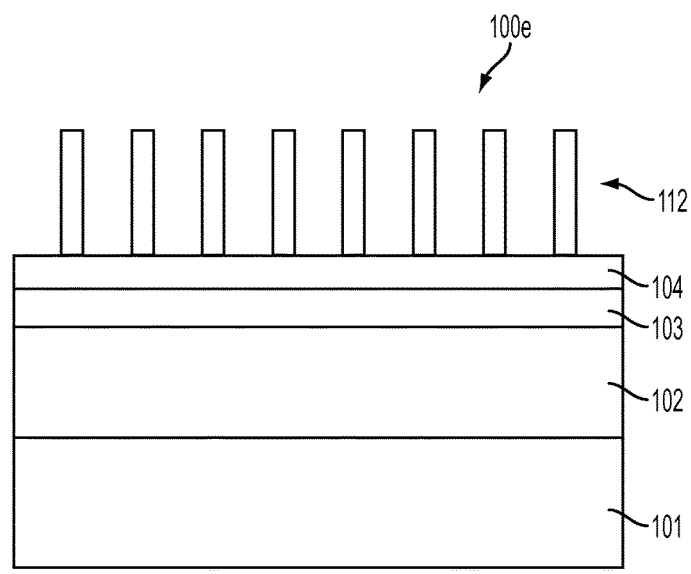
FIG. 5 illustrates the intermediate finFET semiconductor device of FIG. 4 following a spacer etch according to an embodiment of the invention.

In FIG. 5, an intermediate fin field-effect transistor (finFET) device 100e is shown having the spacer layer 111 and base portion 110a of the mandrels etched to form spacers 112. In particular, the horizontal portions of the spacer layer 111 are first removed by anisotropic etching so as to expose the base portion 110a of the mandrels. This is followed by removal of the base portion 110a of the mandrels, resulting in free-standing spacers 112. The etching may be any type of etching, including chemical etching.

Figure 6:
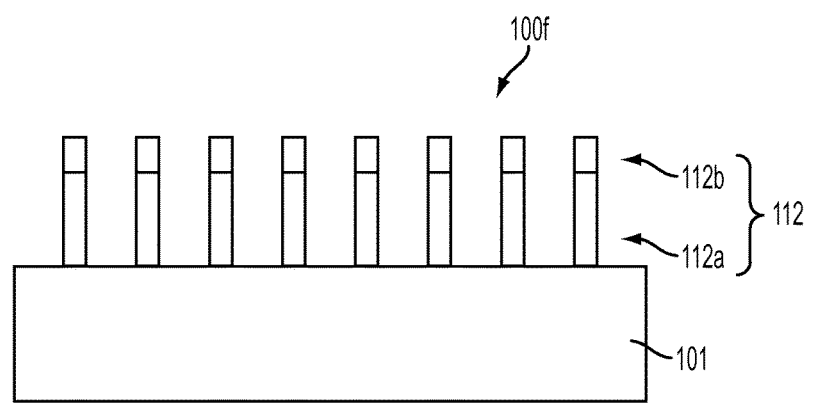
FIG. 6 illustrates the intermediate finFET semiconductor device of FIG. 5 after a spacer-pattern etching process according to an embodiment of the invention.

In FIG. 6, an intermediate fin field-effect transistor (finFET) device 100f is shown on which an etching process has been performed to transfer the pattern of the spacers 112 of FIG. 5 into the layers below. In particular, the etching forms narrow bands, which may be referred to as fins 112, or secondary mandrels 112. The fins 112 include a base portion 112a made of the SiGe layer 102, and a cap 112b made of the first hard mask layer 103.

Figure 7:
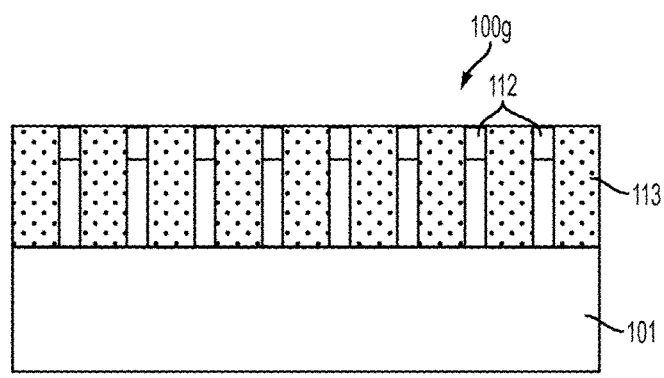
FIG. 7 illustrates the intermediate finFET semiconductor device of FIG. 6 after an oxide fill according to an embodiment of the invention.

In FIG. 7, an intermediate fin field-effect transistor (finFET) device 100g is shown having spaces around the fins 112 filled by an oxide layer 113. The filling may occur by any deposition process. In addition, a chemical-mechanical planarization (CMP) or polishing process may be performed to flatten out an upper surface of the oxide layer 113 and fins 112.

Figure 8:
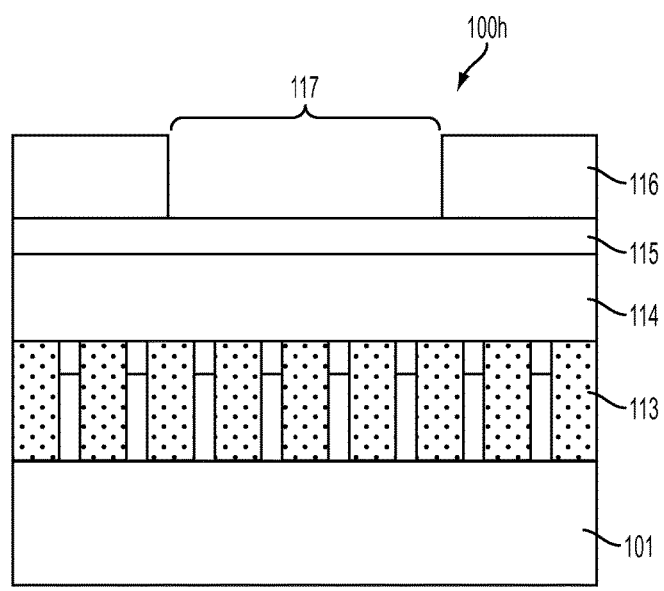
FIG. 8 illustrates the intermediate finFET semiconductor device of FIG. 8 having a sacrificial layer formed according to an embodiment of the invention.

In FIG. 8, an intermediate fin field-effect transistor (finFET) device 100h is shown having a sacrificial layer 114 formed on the oxide layer 113, an anti-reflective coating layer 115 formed on the sacrificial layer 114, and a photoresist layer 116 formed on the anti-reflective coating layer 115. The sacrificial layer 114 may be an organic planarization layer (OPL). In one embodiment, the anti-reflective coating 115 is a silicon anti-reflective coating (SiARC). The photoresist layer 116 may have an opening 117 to define a device region. While one opening is illustrated in FIG. 8, it is understood that embodiments encompass openings of any desired shape to define semiconductor fin-based devices of any desired shapes.

Figure 9:
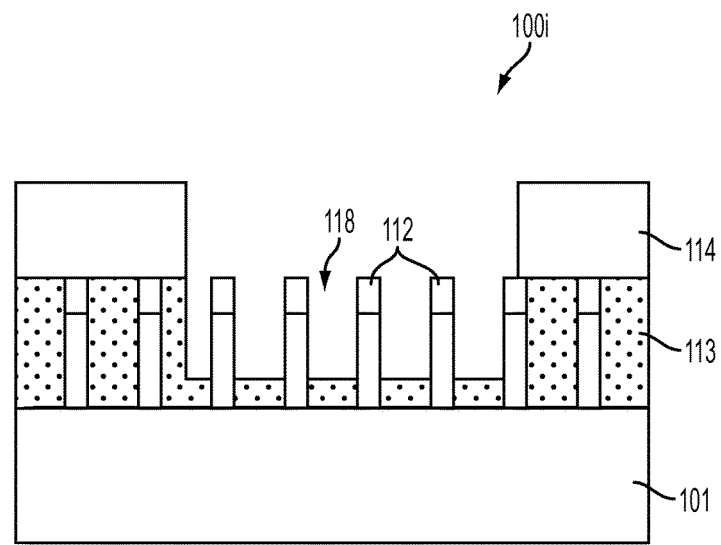
FIG. 9 illustrates the intermediate finFET semiconductor device after forming a device region including silicon fins based on the sacrificial layer pattern according to an embodiment of the invention.

In FIG. 9, an intermediate fin field-effect transistor (finFET) device 100i is shown having in which an etch process has been performed to etch the sacrificial layer 114 and oxide layer 113. In addition, the anti-reflective coating 115 and the photoresist layer 116 have been removed to expose the device region 118. The fins 112 or secondary mandrels 112 are exposed in the device region 118 and are buried in the oxide layer 113 in the non-device regions. In one embodiment, the depth of the etch in the oxide layer 113 is controlled using a timed etch, instead of using an end-pointed RIE process.

Figure 10:
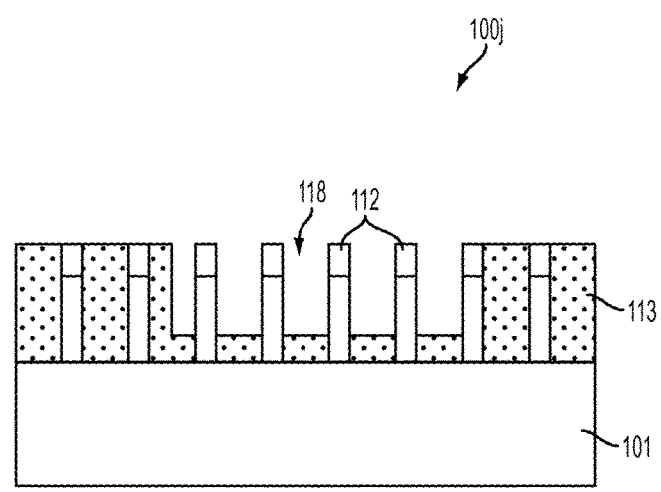
FIG. 10 illustrates the intermediate finFET semiconductor device of FIG. 9 following removal of the sacrificial layer according to an embodiment of the invention.

In FIG. 10, an intermediate fin field-effect transistor (finFET) device 100j is shown having the sacrificial layer 114 removed, such as by mechanical or chemical planarization or polishing or etching.

Figure 11:
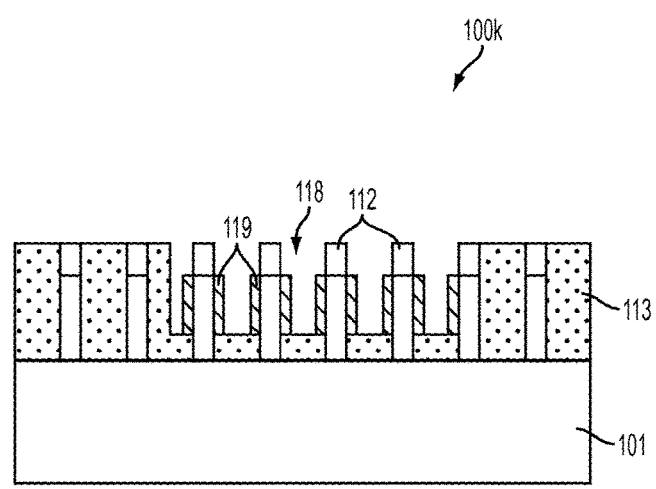
FIG. 11 illustrates the intermediate finFET semiconductor device of FIG. 10 after epitaxially forming densely-spaced fins on sides of the silicon fins according to an embodiment of the invention.

In FIG. 11, an intermediate fin field-effect transistor (finFET) device 100k is shown in which layers of silicon 119 are epitaxially grown onto sides of the exposed fins 112 in the device region 118. In one embodiment, the bases 112a of the fins are made of SiGe and the epitaxial layers 119 are made of silicon. In one embodiment, the epitaxial layers 119 only grow on the SiGe portions of the fins 112 corresponding to the mandrel layer 102 of FIG. 1, and not on the hard mask portions of the fins 112 corresponding to the hard mask layer 103 of FIG. 1.

Figure 12:
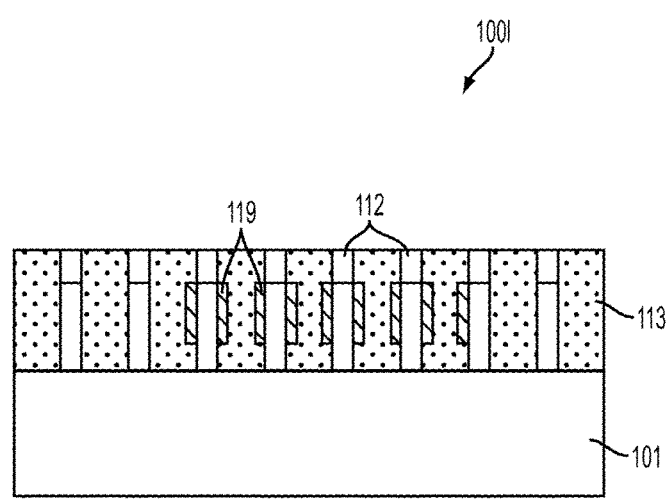
FIG. 12 illustrates the intermediate finFET semiconductor device of FIG. 11 after an oxide fill according to an embodiment of the invention.

In FIG. 12, an intermediate fin field-effect transistor (finFET) device 100l is shown having spaces around the fins 112 filled in with the oxide material 113. The filling may occur by any deposition process.

Figure 13:
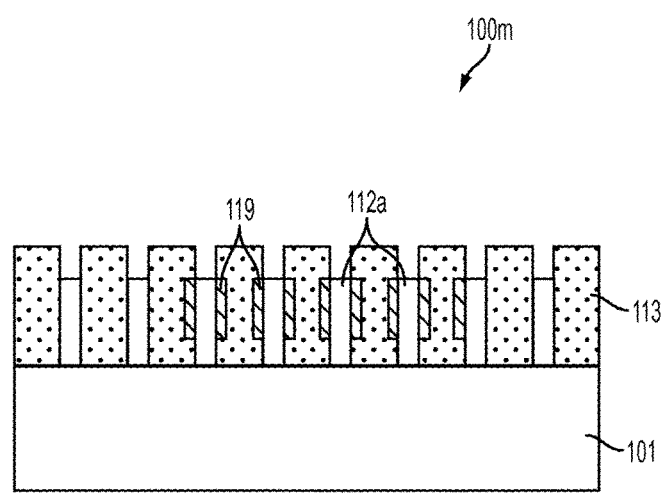
FIG. 13 illustrates the intermediate finFET semiconductor device of FIG. 12 following removal of a mask from the silicon fins according to an embodiment of the invention.

In FIG. 13, an intermediate fin field-effect transistor (finFET) device 100m is shown having the caps 112b removed from bases 112a of the fins 112. The removal may be by any etching process, including chemical, laser, or any other appropriate etching process.

Figure 14:
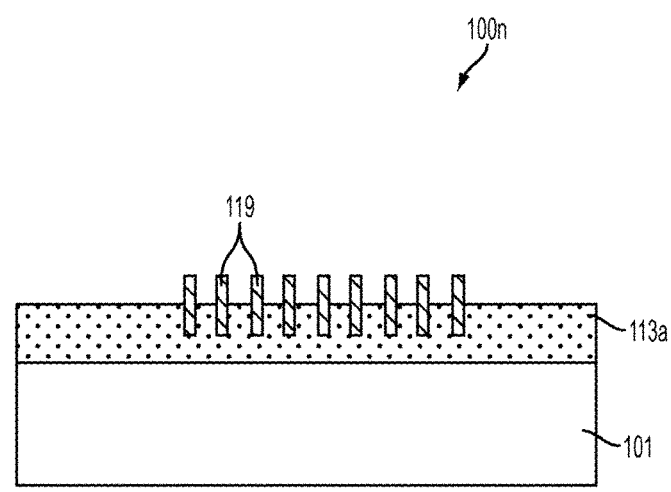
FIG. 14 illustrates the intermediate finFET semiconductor device of FIG. 13 following removal of silicon fins and oxide material to cause the densely-spaced fins to be free-standing according to an embodiment of the invention.

FIG. 14 illustrates an intermediate finFET device 100n having the bases 112a of the fins 112 removed and the oxide layer 113a etched back to expose the epitaxially-grown layers 119 as free-standing fins. In one embodiment, the fins 119 extend into the oxide layer 113a and are separate from each other in the oxide layer 113a.

Figure 15:
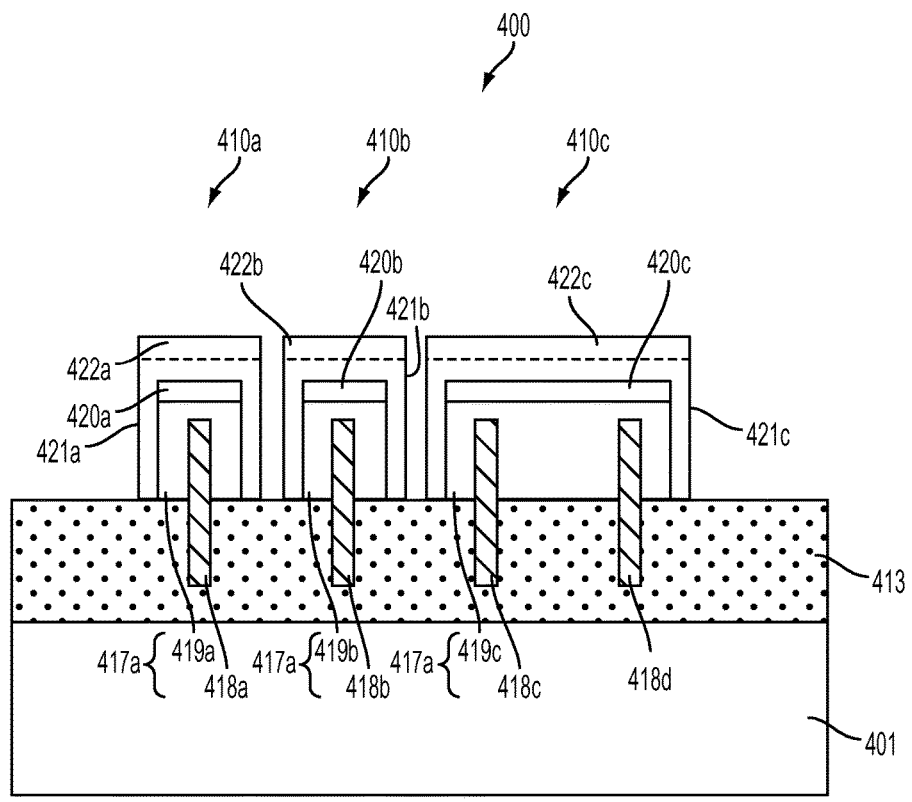
FIG. 15 illustrates a finFET semiconductor device according to an embodiment of the invention.

FIG. 15 illustrates a fin field-effect transistor (finFET) assembly 400 according to an embodiment of the present invention. The finFET assembly 400 includes the substrate 401, a first finFET device 410a, a second finFET device 410b, and a third finFET device 410c. While only three finFET devices are illustrated for purposes of description, embodiments of the invention encompass any number of finFET devices. The first finFET device 410a includes merged source/drain (SD) regions 417a, including a filling layer 419a, or dielectric layer 419a, formed around a fin 418a, and a contact layer 420a formed on the dielectric layer 419a. A gate structure 421a is located between the SD regions 417a, and the gate structure includes a contact 422a.

Similar to the first finFET device 410a, the second finFET device 410b includes merged source/drain (SD) regions 417b, including a filling layer 419b, or dielectric layer 419b, formed around a fin 418b, and a contact layer 420b formed on the dielectric layer 419b. A gate structure 421b is located between the SD regions 417b, and the gate structure 421b includes a contact 422b.

The third finFET device 410c includes merged source/drain (SD) regions 417c, including a filling layer 419c, or dielectric layer 419c, formed around multiple fins 418c and 418d, and a contact layer 420c formed on the dielectric layer 419c. A gate structure 421c is located between the SD regions 417c, and the gate structure 421c includes a contact 422c.

In embodiments of the invention, densely-spaced fins for finFET devices are formed by epitaxially growing the fins on sides of narrow bands of silicon, also referred to as mandrels, or fins. The mandrels may be formed by an SIT process, which is limited to forming fins up to a first predetermined density. By epitaxially growing fins on the mandrels and removing the mandrels, the fins may have a second density that effectively doubles that of the SIT process, or halves the pitch between fins, allowing for the fabrication of compact finFET circuitry.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device, comprising:
   a silicon substrate;
   one or more first fins extending from the silicon substrate into an oxide layer of the silicon substrate;
   epitaxial layers extending from each side of the one or more first fins;
   oxide filler material in a plurality of spaces between each side of the epitaxially-grown first fins;
   a plurality of second fins positioned in the spaces between each of the one or more first fins and epitaxial layers;
   a first opening in the oxide filler material exposing a top surface of the oxide filler material;
   a second opening within the first opening exposing a top surface of the oxide filler material, wherein the second opening exposes the plurality of second fins comprising a device region;
   a gate structure covering a portion of the plurality of second fins wherein the gate structure defines source and drain regions; and
   a contact on the plurality of second fins.

2. The semiconductor device of claim 1, wherein a distance between the one or more first fins is 40 nanometers (nm) or less.

3. The semiconductor device of claim 1, wherein each fin of the one or more first fins is separate from each of the other one or more first fins in the oxide layer.

4. The semiconductor device of claim 1, wherein the one or more first fins are made of silicon.

5. The semiconductor device of claim 1, further comprising filler material on the one or more first fins defining source and drain regions of the semiconductor device.

6. The semiconductor device of claim 5, wherein the filler material comprises an epitaxially-grown silicon-based material formed around the one or more first fins.

* * * * *